United States Patent [19]

Talbot

[11] Patent Number: 4,894,648
[45] Date of Patent: Jan. 16, 1990

[54] INFORMATION HANDLING AND CONTROL SYSTEMS, AND METHODS OF TESTING THE CONDITION OF ELECTRICAL LOADS IN SUCH SYSTEMS

[75] Inventor: Kevin T. Talbot, Lichfield, England

[73] Assignee: Salplex Limited, England

[21] Appl. No.: 240,502

[22] Filed: Sep. 6, 1988

[30] Foreign Application Priority Data

Sep. 21, 1987 [GB] United Kingdom ................ 8722194

[51] Int. Cl.$^4$ ............................................. H04Q 9/00
[52] U.S. Cl. ..................... 340/825.060; 340/825.070; 340/825.170; 340/635; 324/537; 370/112
[58] Field of Search ............... 324/519, 522, 527, 537, 324/133, 555; 340/459, 635, 644, 825.06, 825.07, 825.1, 825.16, 825.17; 361/56, 55, 54; 307/112, 117; 364/132, 141; 370/112, 113

[56] References Cited

U.S. PATENT DOCUMENTS

| 3,599,179 | 8/1971 | Arnold | 324/57 |
|---|---|---|---|
| 4,206,443 | 6/1980 | Britton | 340/825.06 |
| 4,538,106 | 8/1985 | Anderson | 340/635 |
| 4,574,266 | 3/1986 | Valentine . | |
| 4,817,040 | 3/1989 | Bodley-Scott | 340/459 |

FOREIGN PATENT DOCUMENTS

| 2716367 | 10/1978 | Fed. Rep. of Germany | 361/54 |
|---|---|---|---|
| 710799 | 11/1987 | Fed. Rep. of Germany | 324/519 |

OTHER PUBLICATIONS

Jorgenson et al., "Early AC Line Failure Detection for Power Supplies", 9/83, IBM Tech Disclosure vol. 26, No. 4, 1893.

Carroll, "Distribution Network Simulator for Testing Power Supplies," 9/83, IBM Technical Disclosure Bulletin, vol.26, No. 4, 1954.

Primary Examiner—Donald J. Yusko
Assistant Examiner—E. O. Pudpud
Attorney, Agent, or Firm—Kirschstein, Ottinger, Israel & Schiffmiller

[57] ABSTRACT

In a multiplex system for automotive vehicles, battery (+V) current is supplied to each load (70, 71) connected to a non-intelligent slave unit (20) via a power switch (TR) in the slave controlled by a capacitor (CT) which is charged or discharged in an assigned time slot by high or low voltage (A,C) applied on a low current signal line from a remote intelligent unit (10). If a load (70, 71) goes open-circuit then a voltage source (TR1, Z1) in the slave provides low current via a resistor (R2, R3) and the forward direction of a zener diode Z to charge the capacitor CT to an intermediate voltage which is detected at the remote intelligent unit (10) during an assigned load driving time slot. If a load (70, 71) goes short circuit then a thyristor (TH) in thermal contact with its power switch (TR) turns on to turn off the power switch (TR) and provide a discharge path for the capacitor (CT) via the load (70, 71), this discharged condition being detected at the remote intelligent unit during an assigned load driving time slot. This dedicated extra channels (time slots) are not required at the slave unit for open-circuit or short-circuit load testing.

25 Claims, 2 Drawing Sheets

INFORMATION HANDLING AND CONTROL SYSTEMS, AND METHODS OF TESTING THE CONDITION OF ELECTRICAL LOADS IN SUCH SYSTEMS

BACKGROUND OF THE INVENTION

1. Field of the Invention

This invention relates to information handling and control systems, and to methods of testing the condition of electrical loads in such systems.

2. Description of Related Art

An example of such a system in the form of an automotive vehicle electrical system is known from the article "Multiplexing for the automotive industry" by W. R. Betts in GEC REVIEW, Vol. 2, No. 1, 1986 at pages 32 to 36.

FIG. 1 of the accompanying drawings is an overall schematic diagram corresponding to the Figure shown on page 34 of the GEC REVIEW article.

In FIG. 1 there is shown a star wired system with an intelligent, central, master unit 10 and a number of non-intelligent, local, slave units 20. Power from a battery +V is supplied to the master unit 10 and via fuses 30 to the slave units 20. A low current signalling link 40 is connected from the master unit 10 to each slave unit 20. Electrical switches, sensors, and high current loads (not shown in FIG. 1) are connected to the slave units 20 and their interaction is controlled from the master unit 10 by means of time slot assignment multiplex.

In the GEC REVIEW article it is mentioned that each signalling bus (link) has a clock line and a data (signal) line. The clock line carries bursts of clock pulses, usually eight or sixteen pulses per burst which define the time slots for the data line. For sixteen time slots each slave unit thus provides sixteen interfaces (channels), and during each time slot a single digital data bit or analogue level is transferred between that slave and the master on the data line, for example a command from the master to the slave to operate a load, such as a lamp or a motor, or an indication of the state of a sensor from the slave to the master. In a discussion of testability on page 36 of this article it is mentioned that by monitoring the current drawn from the battery the state of each load can be individually checked. This implies that a dedicated separate one of the slave channels is required for testing each load and this implication is confirmed by a block diagram of the slave unit on page 35 of this article which shows one group of channels connected to loads via an "outputs" block and these loads connected via a "diagnostics" block to a separate group of channels.

For a system having a given number of channels provided at each slave unit as described above, then for each slave unit to which it is required to connect one or more loads the provision of a separate test channel for each load is disadvantageous in limiting the number of loads and possibly also switches and sensors which can be connected to that slave unit.

SUMMARY OF THE INVENTION

An object of the present invention is to overcome the disadvantage just mentioned, at least for open-circuit detection of loads and possibly also for short-circuit detection of loads.

According to the invention there is provided an information handling and control system comprising:

(a) at least one power switch provided in a local unit to control a high current each to a respective load;

(b) a low current signalling link provided between the local unit and a remote intelligent unit;

(c) at least one capacitor provided in the local unit each connected to the control electrode of a respective said power switch;

(d) means provided in the local unit for connecting each capacitor to the signalling link during a respective time slot assigned to the respective power switch in successive frame periods;

(e) drive voltage means provided in the intelligent unit for applying a first or a second drive voltage within a said respective assigned time slot respectively to charge or discharge said respective capacitor to a high or a low voltage value sufficient respectively to turn the respective power switch on or off, the respective capacitor maintaining the respective power switch continuously on or continuously off between successive frame periods when the respective load is in normal condition;

(f) charging means provided in the local unit effective to charge each said capacitor to an intermediate voltage value only when the respective load is in open-circuit condition following the respective capacitor being discharged to said low voltage value by said second drive voltage and while no drive voltage is applied to the respective capacitor from the drive voltage means; and (g) detection means provided in the intelligent unit which are operable to detect the condition of each said capacitor at a time in a selected said respective assigned time slot when the respective capacitor will be at said intermediate voltage value if the respective load is in open-circuit condition and hence to detect whether or not the respective load is in open-circuit condition.

An automotive vehicle electrical system may include an information handling and control system as described in the previous paragraph.

The charging means mentioned as item (f) above may include a respective zener diode connected between each capacitor and the respective load to limit the respective capacitor to said high voltage value when charged by the first drive voltage, a source of said intermediate voltage, and a respective resistor connected between the source of said intermediate voltage and each load such that, following the respective capacitor being discharged to said low voltage value by said second drive voltage and while no drive voltage is applied to the respective capacitor from the drive voltage means, if the respective load is in normal condition a low current from said respective resistor flows through the respective load and the capacitor remains at said low voltage value whereas if the respective load is in open-circuit condition the low current from said respective resistor which flows in the forward direction through the respective zener diode charges the respective capacitor to said intermediate voltage value. It will be appreciated that a zener diode may in any case be present to protect each power switch, and so the only extra circuitry required at the local unit to provide the charging means in this manner for open-circuit testing of all the loads connected to a slave unit is a single source of said intermediate voltage and a resistor for each load. The detection means in the intelligent unit may consist of an analogue-to-digital converter and a microprocessor which are in any case present to detect the condition of sensors attached to local units of the system and so only additional suitable programming of the microprocessor is required in the intelligent unit for the open-circuit testing function.

In a system according to the invention, the second drive voltage may be applied to ensure that a said capacitor is at said low voltage value at the end of said respective assigned time slot in the frame period preceding that containing said selected time slot, in which case the detection means are operated at the beginning of said selected time slot to detect whether or not the respective load is in open-circuit condition. This means of testing for open-circuit condition of a load when it is switched off is particularly applicable for loads which are regularly switched in use, for example motors.

A system according to the invention may also comprise:

(h) individual power switch protection means connected to each power switch and to the respective capacitor, the individual protection means being non-conductive when the respective load is in normal condition and becoming conductive when the respective power switch is on with the respective load in short-circuit condition, such that when the individual protection means is conductive the respective capacitor discharges to said low voltage value via the individual protection means and the respective power switch turns off; in which case the detection means are also operable to detect the condition of each capacitor at a time in a selected said respective assigned time slot when the respective capacitor will be at said low voltage value only if the respective load is in a short-circuit condition and hence to detect whether or not the respective load is in short-circuit condition.

It will be appreciated that in a system according to the invention the protection means may in any case be present to protect each power switch, and so no extra circuitry is required at the local unit for short-circuit testing of each load. The detection means in the intelligent unit may consist of an analogue-to-digital converter and a microprocessor which are in any case present to detect the condition of sensors attached to local units of the system and so only additional suitable programming of the microprocessor is required in the intelligent unit for the short-circuit testing function.

The power switch protection means may comprise a semiconductor switch thermally connected to the power switch such that the semiconductor switch becomes conductive above a predetermined temperature responsive to heat generated in the power switch. The semiconductor switch may be a thyristor.

The protection means may be connected such that the capacitor discharges via the protection means and via the load.

It should be mentioned that it is a known failure mode of triacs and thyristors that they will turn on above a certain temperature. It is furthermore known from Patent document EP No. 208970A to use this characteristic to provide temperature protection for a MOSFET transistor by having a thyristor thermally connected to the transistor with the two main electrodes of the thyristor connected across the gate and source electrodes of the transistor. The thyristor is designed to turn on before a temperature, which may be between 130° and 180° C., critical for the MOSFET is reached. However, this disclosure of passive protection of a transistor does not in any way indicate the possibility of connecting the thyristor to a capacitor in the local unit of a remote control system such that the state of the capacitor both controls the transistor and provides information readback on the condition of a load connected to the transistor.

If open-circuit condition testing of a load in a system according to the invention is required while the load is switched on, that is to say while the capacitor is maintaining the power switch connected to that load continuously turned on between successive frame periods, then this can be achieved if the capacitor is temporarily discharged during an assigned time slot.

Thus a system according to the invention may be provided in which in a first segment of said selected time slot the second drive voltage is applied for a period sufficient to discharge the respective capacitor to said low voltage value, then in a second segment of said selected time slot no drive voltage is applied to the respective capacitor from the drive voltage means for a period sufficient for the respective capacitor to reach said intermediate voltage value, then in a third segment of said selected time slot the first or second drive voltage is applied for a period sufficient respectively to charge or discharge the respective capacitor to said high or low voltage value. The possibility of discharging the capacitor in the third segment is mentioned since, although the three segment selected time slot is provided to enable open-circuit testing of a load while it is switched on, once the three segments are so provided they may also be used for open-circuit testing the load while it is switched off.

If the three segment selected time slot is provided as just described to enable open-circuit testing of a load while it is switched on, then the load may also be tested for short-circuit condition at an appropriate time in such a three segment time slot if the power switch protection means previously described is provided.

The frequency at which open-circuit load testing is performed, and also the frequency at which short-circuit load testing is performed if that is also provided for, may be selected to meet particular requirements, and a different frequency may be required for the two types of test.

Thus, in a system according to the invention in the case where there is provision for both open-circuit and short-circuit testing, the detection means may be operable to detect whether or not each load is in open-circuit condition in respective selected frame periods at intervals of a respective selected first plurality of frame periods and to detect whether or not the respective load is in short-circuit condition in respective selected other frame periods at intervals of a respective selected second plurality of frame periods According to the invention there is also provided a method of testing each said load in any one of the systems described above having provision for open-circuit load testing, in which said drive voltage means are operated under control of test equipment connected to the intelligent unit, in which each said selected time slot is selected and said detection means are operated under control of said test equipment, and in which the test equipment registers whether or not the respective load is in open-circuit condition. If the system also has provision for short-circuit testing as described above then the test equipment will also register whether or not each load is in short-circuit condition.

According to the invention there is also provided a local unit for use in any one of the systems described above having provision for open-circuit testing, said local unit comprising each said power switch, each said capacitor, said means for connecting each said capacitor to the signalling link and said charging means.

According to the invention there is further provided a method of testing each said load connected to said respective power switch in a local unit as just described before assembly of the local unit in the system, in which said low current signalling link is provided between the local unit and test equipment, in which said drive voltage means are reproduced in and are operated under control of the test equipment, in which said detection means are reproduced in the test equipment and each said selected time slot is selected and said detection means are operated under control of the test equipment, and in which the test equipment registers whether or not the respective load is in open-circuit condition.

In the case where the system also has provision for short-circuit testing as described above, a local unit according to the invention will also include each said power switch protection means, and furthermore in a method of testing as just described the test equipment will also register whether or not each load is in short-circuit condition.

BRIEF DESCRIPTION OF THE DRAWINGS

The invention will now be described in more detail with reference to the accompanying drawings, in which FIG. 1, which has already been described above in relation to a known prior art system, also serves as an overall schematic diagram applicable to the system of the invention.

DETAILED DESCRIPTION OF THE PREFERRED EMBODIMENT

Figure 1:
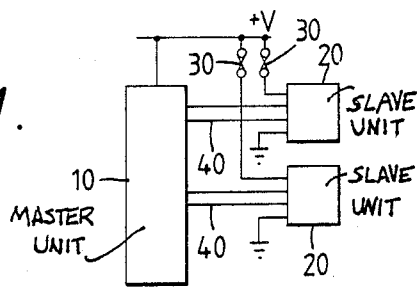
Figure 2:
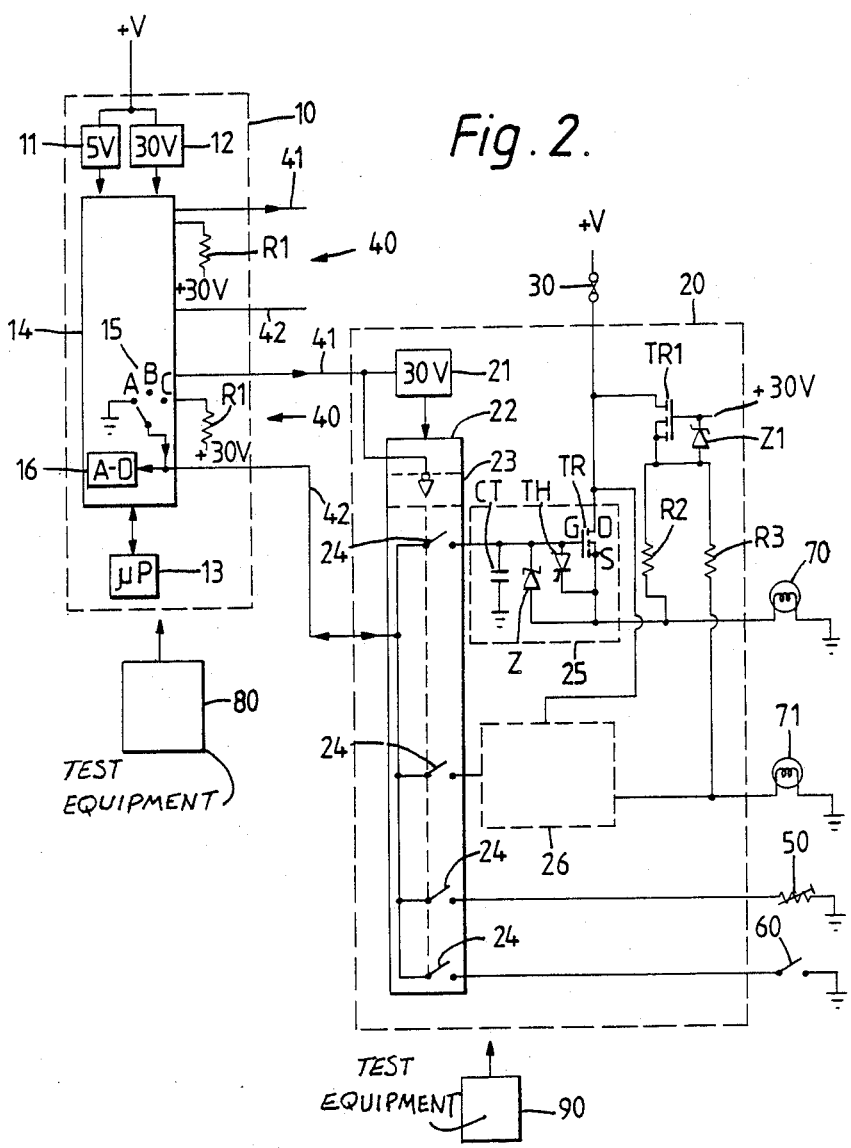
FIG. 2 shows details of the system of FIG. 1 incorporating the features of the invention.

Referring now to FIG. 2, the master unit 10 includes 5 volt and 30 volt power supplies 11, 12 fed by the battery +V which is 12 volts in an automotive vehicle electrical system. The power supplies 11, 12 are fed to a microprocessor 13 and a custom unit 14 connected thereto in the master unit 10. Each low current signalling link 40 to a slave unit 20 includes a clock pulse line 41 and a signal line 42. The clock pulses on the lines 41 are of 30 volts amplitude and control the timing of the system timeslot assignment multiplex. Within each time slot drive voltage means 15 in the custom unit 14 connected to each signal line 42 apply at any one time a first drive voltage or a second drive voltage or no drive voltage to that signal line 42. The drive voltage means 15 is a tri-state drive voltage circuit shown schematically as a switch having three positions A, B and C. The first drive voltage corresponds to position C shown as applying the fixed voltage of 30 volts via a pull-up resistor R1, the second drive voltage corresponds to position A shown as applying zero volts, and the application of no drive voltage results from an applied high impedance corresponding to position B.

In each slave unit 20, one of which is shown in FIG. 2, a 30 volt power supply 21 is derived from the clock pulses on the line 41. A demultiplexing unit 22 has timing circuits 23 responsive to the clock pulses on the line 41 and from which switches 24 are operated to connect the low current signalling link of the signal line 42 through a corresponding channel in the appropriate assigned time slot. Each slave unit 20 can connect for example sixteen channels, four of which are shown in FIG. 2.

A variable resistive sensor 50 is shown wired to one of the channels in the slave unit 20. With the sensor 50 connected in the signal line 42 during the appropriate assigned time slot and the drive voltage circuit 15 in the master unit 10 in condition C during that time slot, then the voltage on the signal line 42 is an input signal from the sensor 50 due to its resistance, and this input signal is recognised via an analogue-to-digital converter 16 in the master unit 10.

An electrical switch 60 is shown wired to another of the channels in the slave unit 20. With the switch 60 connected in the signal line 42 during the appropriate assigned time slot and the drive voltage circuit 15 in the master unit 10 in condition C during that time slot, then the voltage on the signal line 42 due to the resistance between two terminals of the switch 60 is recognised via the analogue-to-digital converter 16 in the master unit 10 as a binary input signal from the switch 60.

Two other of the channels in the slave unit 20 are shown each connected in the slave unit to a respective output circuit 25 or 26. The state of the drive voltage circuit 15 during the appropriate assigned time slot will provide an output signal on the signal line 42 to the respective output circuit 25 or 26 to control a high current from the battery +V via a fuse 30 to a respective load 70 or 71, for example a lamp, wired to the slave unit 20.

The microprocessor 13 in the master unit 10 ensures that the output signal on a signal line 42 to control a high current to a particular load 70, 71 connected to any one of the slave units 20 is in response to an input signal from a particular switch 60 which is to be associated with that load 70, 71 and is connected to any one of the slave units 20.

The low currents in the low current signalling links of the system, for example through the signal line 42 to the switch 60 or to the output circuit 25 or 26 may be, for example, not greater than 5 mA. The high currents through the loads of the system, for example to the load 70 controlled in response to operation of the switch 60 may be, for example, up to 10 amps.

Referring again to the output circuit 25, the passage of high current from the battery +V to the load 70 when that load is in normal condition is controlled by the on or off condition of a power switch TR in the form of a power MOSFET transistor having its drain electrode D connected to the battery +V and its source electrode S connected to the load 70. A capacitor CT is connected to the control electrode G of the power switch TR, and the demultiplexing unit 22 connects the capacitor CT to the signal line 42 during a time slot, for example 100 μs, assigned to the power switch TR in successive frame periods, for example at 100 Hz. Within each time slot assigned to the power switch TR, the drive voltage circuit 15 applies the first drive voltage (position C) or the second drive voltage (position A) to charge or discharge the capacitor CT to a high or a low voltage value sufficient respectively to turn the power switch TR on or off. The high voltage value of the capacitor CT is approximately 20 volts determined by the battery +V voltage of approximately 12 volts and by a zener diode Z connected between the capacitor CT and the load 70 to protect the MOSFET power switch TR by limiting its Vgs to approximately 8 volts. The low voltage value of the capacitor CT is essentially zero volts. The leakage in the system is arranged to be sufficiently small that the capacitor CT maintains the power switch TR continuously on or continuously off between successive frame periods when the load 70 is in normal condition. The output circuit 26 to which the load 71 is connected is the same as the output circuit 25.

A low power MOSFET transistor TR1 is provided within the slave unit 20 connected directly to the battery +V and via a resistor R2 to the load 70. The transistor TR1 is maintained continuously on by +30 V from the power supply 21, and a zener diode Z1, to provide a source of the battery voltage +V, which at approximately 12 volts is intermediate the high and low voltage values of the capacitor CT. The resistor R2 is chosen such that the current from that resistor has a low value of the same order as that carried by the signal line 42. Another resistor R3 having the same value as the resistor R2 is connected between the transistor TR1 and the load 71. If the load 70 is in normal condition the low current from the resistor R2 flows continuously through the load 70, being insufficient to operate the load 70. Following the capacitor CT being discharged to its low voltage value by the drive voltage circuit 15 and during the time in which the capacitor CT is disconnected from the signal line 42 between successive frame periods, low current from the resistor R2 flows to the source S of the transistor TR and forward through the zener diode Z to the gate G of the transistor TR so that the transistor TR is held off by the source S being higher than the gate G. If the load 70 is normal during this time, the resistor R2 is sufficiently high to pull the source S of transistor TR to near zero volts so that capacitor CT remains at the low voltage value of essentially zero volts. However, if the load 70 is in open circuit condition during this time the low current from the resistor R2 which flows in the forward direction through the zener diode Z charges the capacitor CT. In ths case the source S of the transistor TR is held at slightly over 12 volts, because of the intrinsic diode between the source S and drain D, and the capacitor CT charges to the intermediate voltage value of 12 volts. The transistor TR1 and zener diode Z1, the resistors R2 and R3, and the zener diode Z in each of the output circuits 25 and 26 thus constitute charging means effective to charge the capacitor CT in each output circuit to the intermediate voltage value of 12 volts only when the respective load 70, 71 is in open circuit condition following the respective capacitor CT being discharged to its low voltage value by the second drive voltage (position A) from the drive voltage means 15 and while no drive voltage is applied to the respective capacitor CT from the drive voltage means 15.

The analogue-to-digital converter 16 and the microprocessor 13 in the master unit 10, with suitable programming of the microprocessor 13, provide detection means which are operable to detect the condition of the capacitor CT in each of the output circuits 25, 26 at a time when the respective capacitor CT will be at the intermediate voltage value of 12 volts if the respective load 70, 71 is in open-circuit condition and-hence to detect whether or not the respective load 70, 71 is in open-circuit condition. This detection will be explained in more detail later with reference to FIG. 3.

In each of the output circuits 25, 26 a thyristor TH is provided with its two main electrodes connected across the gate electrode G and source electrode S of the power switch TR. The thyristor TH is thus connected to the capacitor CT as well as to the power switch TR, and is moreover connected between the capacitor CT and the load 70, 71. The thyristor TH is thermally connected to the MOSFET power switch TR and provides protection means for the power switch TR. Thus when the respective load 70, 71 is in normal condition the thyristor is non-conductive. However, if the power switch TR is on with the load in short-circuit condition, the thyristor TH will become conductive above a predetermined temperature responsive to heat generated in the power switch TR so that the power switch TR then turns off. The thyristor may, for example, be designed to turn on at 150° C. In the context of the present system as has been described above, the power switch TR is turned on and maintained continuously on while the capacitor CT is charged at its high voltage value when the load 70, 71 is in normal condition. If the thyristor TH turns on, then the capacitor CT will discharge to its low voltage value, zero volts, via the thyristor TH and the load 70, 71. Then for so long as the thyristor TH is above its turn on temperature, application of the first drive voltage (condition C) from the drive voltage circuit 15 to the capacitor CT will fail to charge the capacitor CT and the power switch TR will remain turned off.

Possible modifications to the arrangement described in the previous paragraph are as follows. The thyristor TH could be connected across the capacitor CT, so that when the thyristor TH is conductive the capacitor CT discharges through the thyristor TH directly to ground and not via the load 70, 71. A different semiconductor switch, such as a triac or a bipolar transistor, having a suitable turn on temperature may be used instead of the thyristor. The power switch protection means could, instead of relying on a turn on temperature, be arranged in a suitable circuit so that when the power switch is overloaded the protection means becomes conductive and both turns off the power switch TR and provides a discharge path for the capacitor CT.

The effect of the thyristor TH, or other power switch protection means as described above, on the state of the capacitor CT enables the detection means in the master unit to detect whether or not each load 70, 71 is in short-circuit condition as will be explained later with reference to FIG. 3.

Figure 3:
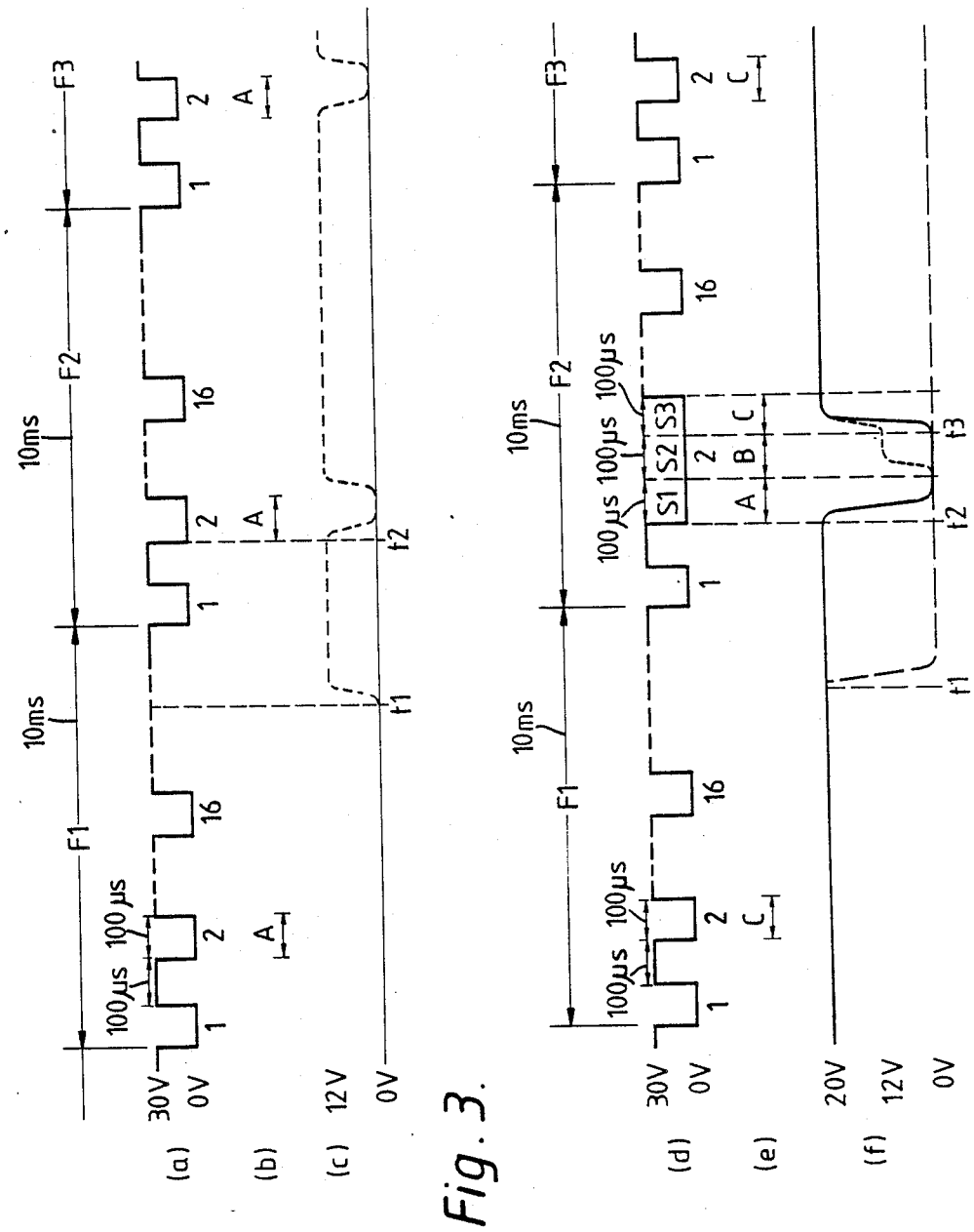
FIG. 3 shows timing diagrams illustrating operation of the system of FIG. 2.

Referring now to FIG. 3, timing diagram (a) shows clock pulses of 30 volts amplitude on the line 41 connected to slave unit 20. A burst of sixteen clock pulses defines time slots 1, 2 . . . 16 of 100 μs duration, each separated by 100 μs, during each of which one of the switches 24 in the demultiplexing unit 22 shown in FIG. 2 connects the signal line 42 through a corresponding channel. Each burst of sixteen clock pulses occurs at the beginning of successive frame periods of 10 ms duration. In the case where time slot 2 is assigned to output circuit 25 shown in FIG. 2, timing diagram (b) shows the situation where the power switch TR in output circuit 25 is intended to be continuously turned off during three successive frame periods F1, F2, F3 by the drive voltage circuit 15 applying the second drive voltage (condition A) to the line 42 during time slot 2 in each of those frame periods. The full line of timing diagram (c) shows that as a result of the drive voltage applied as shown in (b), the capacitor CT in the output circuit 25 will be continuously in its low voltage state of zero volts if the load 70 is in normal condition. The dotted line of diagram (c) shows the condition of this capacitor CT if the load 70 becomes open-circuit at the time t1 in frame period F1 after time slot 2. In this case the capacitor CT will charge to the intermediate voltage of 12 V where it will remain until the beginning of time slot 2 in frame period F2 when the second drive voltage (condition A) will discharge the capacitor CT to zero volts. When the capacitor CT is disconnected from the line 42 at the end of time slot 2 in frame period F2 the capacitor CT will again charge to the intermediate voltage of 12 V where it will remain until the beginning of time slot 2 in frame period F3. The capacitor CT will then discharge and charge in the same manner as it did in frame period F2. If, under control of the microprocessor 13, the analogue-to-digital detector 16 is operated to detect the condition of the capacitor CT in output circuit 25 at the beginning of time slot 2 in frame period F2, time t2, this will detect whether or not the load 70 is in open-circuit condition. It will be appreciated that detection of zero volts on the capacitor CT at time t2 does not indicate that the load 70 is in normal condition, since the capacitor CT would also be at zero volts if the load 70 were in short-circuit condition whereby the current from the resistor R2 would also flow through the load 70.

It is the application of the second drive voltage (condition A) to ensure that the capacitor CT is at its low voltage value at the end of time slot 2 in the preceding frame period F1 which enables time slot 2 in frame period F2 to be selected for testing for open-circuit condition of the load 70 at the beginning of that time slot 2 in frame F2. Thus the application of the second drive voltage (condition A) as shown in time slot 2 of frame F2 enables time slot 2 in frame period F3 to be selected as well or instead for testing for open-circuit condition of the load 70. The frequency at which open-circuit load testing is performed may be selected to meet particular requirements, for example it may be sufficient to test the load 70 for open-circuit condition once per second, that is at intervals of one hundred frame periods. Considering the two loads 70, 71 the detection means in the master unit 10 may be operable to detect whether or not each load is in open-circuit condition in respective selected frame periods at intervals of a respective selected plurality of frame periods.

If open-circuit condition testing of the load 70 or 71 is required while that load is switched on, that is to say while the capacitor CT in the respective output circuit 25, 26 is maintaining the respective power switch TR continuously turned on between successive frame periods, then this can be achieved if the respective capacitor is temporarily discharged during a selected time slot assigned to the respective power switch as will now be described with reference to timing diagrams (d), (e) and (f) shown in FIG. 3.

Timing diagram (d) shows the clock pulses of 30 volts amplitude on the line 41 which are the same as those shown in timing diagram (a) except that time slot 2 in frame period F2 is extended to connect the capacitor CT in the output circuit 25 shown in FIG. 2 to the signal line 42 for a duration of 300 µs instead of the normal 100 µs. Timing diagram (e) shows the first drive voltage (condition C) applied to the line 42 for the whole of time slot 2 in frame periods F1 and F3. In time slot 2 in frame period F2, the second drive voltage (condition A) is applied for a first 100 s segment S1 which is a period sufficient to discharge the capacitor CT to its low voltage value of zero volts, no drive voltage (condition B) is applied for a second 100 µs segment S2 which is a period sufficient for the capacitor CT to reach the intermediate voltage value of 12 volts, and the first drive voltage (condition C) is applied for a third 100 µs segment S3 which is a period sufficient for the capacitor CT to charge to its high voltage value of 20 volts.

The full line of timing diagram (f) shows that, as a result of the drive voltage applied as shown in (e), if the load 70 is in normal condition then the capacitor CT in the output circuit 25 will be in its high voltage condition of 20 volts continuously except for during the extended time slot 2 in frame period F2. In the first segment S1 of the extended time slot 2 the capacitor CT will discharge to its low voltage value of zero volts, it will remain at zero volts during the second segment S2 and it will charge to its high voltage value of 20 volts during the third segment S3.

The dotted line of timing diagram (f) shows that, if the load 70 becomes open-circuit at some time t1 in frame period F1 after time slot 2, then the capacitor CT will also be in its high voltage state of 20 volts continuously except for during the extended time slot 2 in frame period period F2 and it will also discharge to its low voltage value of zero volts in the first segment S1 of the extended time slot 2. However, in this case the capacitor CT will charge to its intermediate voltage value of 12 volts during the second segment S2 before charging to its high voltage value of 20 volts during the third segment S3. Thus if, under control of the microprocessor 13, the analogue-to-digital detector 16 is operated to detect the condition of the capacitor CT in output circuit 25 at the end of segment S2 in extended time slot 2 in frame period F2, time t3, this will detect whether or not the load 70 is in open-circuit condition.

The dashed line of timing diagram (f) shows that, if the thyristor TH in the output circuit 25 becomes conductive at the time t1 in frame period F1 after time slot 2 due to the load 70 having become short-circuit at some previous time, then the capacitor CT will discharge to its low voltage condition of zero volts where it will be during the whole of the extended time slot 2 in frame period F2 and where it will remain until such time as the thyristor TH reverts temporarily to its non-conductive condition. Thus if the detection means in the master unit 10 is operated to detect the condition of the capacitor CT in output circuit 25 at the beginning of segment S1 in time slot 2 in frame period F2, time t2, this will detect whether or not the load 70 is in short-circuit condition. The microprocessor 13 in the master unit will be programmed to ensure that time slot 2 in frame period F2 is selected to test the load 70 for short-circuit condition only when the first drive voltage (condition C) has been applied in time slot 2 in the preceding frame period F1. In this case the capacitor CT will be at zero volts at time t2 only if the load 70 is in short-circuit condition. It will be appreciated that for the purpose of short-circuit load detection the drive voltages applied during the time slot 2 in frame period F2 are immaterial and three segments are not necessary. In particular, a normal length (100 µs) time slot in which the first drive voltage (condition C) is applied may be selected for short-circuit load detection, the detection means being operated at any time during that time slot. It is convenient, however, that if a three segment time slot having the applied voltage conditions A, B and C in succession is provided to enable open-circuit condition testing of the load 70 while that load is switched on, then such a time slot and applied voltage conditions may also be used for short-circuit load condition testing.

If open-circuit condition testing, or short-circuit condition testing, or both, of the load 70 is performed as described with reference to timing diagrams (d), (e) and (f) in FIG. 3, then each time the three segment time slot is used for testing as described the power switch TR in the output circuit 25 will be temporarily turned off to interrupt the flow of current to that load for less than 300 μs. This will have an insignificant effect on a load in normal condition, that is to say that the turn off time will not cause a lamp to noticeably dim or a motor to noticeably slow down.

The frequency at which open-circuit load testing is performed as described with reference to timing diagrams (d), (e) and (f) in FIG. 3 may be selected as required, for example once per second.

The frequency at which short-circuit load testing is performed may also be selected to meet particular requirements, for example ten times per second, that is at intervals of ten frame periods. Thus, while the load 70 is switched on, it may be tested for open-circuit condition in selected frame periods for example once per second and also tested for short-circuit condition in other selected frame periods for example ten times per second. If the load 71 is switched on at the same time, it may also be tested for open-circuit condition in selected respective frame periods and tested for short-circuit condition in other selected respective frame periods.

The use of the three segment extended time slot 2 for testing the load 70 as described above will delay the connection of the remaining channels 3 to 16 of the slave unit 20 to the signal line 42 by 200 μs, but this will not significantly affect the operation of the loads, sensors or switches connected to those other channels. The use of a three segment extended time slot to test the load 71 will also not significantly affect the operation of the other channels even if this is in the same frame period in which the load 70 is tested. In fact a load could be connected to all sixteen channels at the same slave unit 20 and they could all be tested by a three segment extended time slot in the same frame period, since this would only extend the normal time of 3.2 ms occupied by the burst of sixteen clock pulses to 6.4 ms which can be accommodated within the 10 ms frame period.

Some possible variations in the use of the three segment time slot as described above with reference to timing diagrams (d), (e) and (f) in FIG. 3 will now be described.

If the three segment time slot having the applied voltage conditions A, B and C in succession is provided to enable open-circuit condition testing of the load 70 while that load is switched on, then the three segment time slot with a modification of the applied voltage conditions may also conveniently be used to enable open-circuit testing of the load 70 while that load is switched off, that is to say when the second drive voltage (condition A) is applied in time slot 2 in frame periods F1 and F3. One such modification is to apply the second drive voltage (condition A) in the third segment S3 to ensure that the capacitor CT is discharged at the end of the extended time slot. The condition of the capacitor CT may then be detected either at the beginning of the first segment S1 (time t2) or at the end of the second segment S2 (time t3) to detect whether or not the load is in open-circuit condition. The other such modification is to apply the second drive voltage (condition A) during all three segments S1, S2 and S3, and in this case the load may be open-circuit tested at the beginning of the first segment S1 (time t2).

The three segment time slot has been described above with all three segments S1, S2 and S3 having the 100 μs normal time slot duration. This is convenient for timing purposes and may be necessary to accommodate the slow response of the filtered signal line 42 in segments S1 and S3, but it is not fundamental. The second segment S2 must be long enough to allow the capacitor CT to charge to the intermediate voltage of 12 volts, but this does not have to be a full 100 μs. In general the three segment operation could be compressed to less than 300 μs, and maybe to the normal time slot duration of 100 μs.

Referring again to FIG. 2, when the complete information handling and control system as described above has been manufactured and installed, for example as part of an automotive vehicle electrical system, then all the items connected to the local slave units 20, that is sensors 50, switches 60 and loads 70, 71 may be tested via the central master intelligent unit 10. In vehicles with driver information displays the test function can be incorporated within the master unit 10 as a programmable function of the microprocessor 13. Otherwise, the vehicle builder or vehicle servicer can perform these tests with test equipment 80 when connected to the master unit 10. In this case the drive voltage circuit 15 is operated under control of the test equipment 80, each time slot selected for load condition testing is selected and the detection means consisting of the analogue-to-digital converter 16 and the microprocessor 13 are operated under control of the test equipment 80, and the test equipment 80 registers whether or not each load is in open-circuit condition or in short-circuit condition as the case may be.

Before the complete information handling and control system as described above has been manufactured and installed, for example during manufacturing stages of an automotive vehicle, then each of the items connected to one local slave unit 20, that is a selection of sensors 50, switches 60 and loads 70, 71 may be tested using test equipment 90 connected to that slave unit 20. In this case a low current signalling link is provided between the local unit 20 and the test equipment 90, the drive voltage circuit 15 is reproduced in and operated under control of the test equipment 90, the detection means are reproduced in the test equipment 90, each time slot selected for load condition testing and the detecting means operated under control of the test equipment 90, and the test equipment 90 registers whether or not each load is in open-circuit condition or in short-circuit condition as the case may be.

The information handling and control system can have application other than to automotive vehicle electrical systems, for example to domestic appliances such as washing machines or to industrial control systems such as for heating and ventilation.

I claim:

1. An information handling and control system comprising:
   (a) at least one power switch provided in a local unit to control a high current each to a respective load;
   (b) a low current signalling link provided between the local unit and a remote intelligent unit;
   (c) at least one capacitor provided in the local unit each connected to the control electrode of a respective said power switch;
   (d) means provided in the local unit for connecting each capacitor to the signalling link during a respective time slot assigned to the respective power switch in successive frame periods;

(e) drive voltage means provided in the intelligent unit for applying a first or a second drive voltage within a said respective assigned time slot respectively to charge or discharge said respective capacitor to a high or a low voltage value sufficient respectively to turn the respective power switch on or off, the respective capacitor maintaining the respective power switch continuously on or continuously off between successive frame periods when the respective load is in normal condition;

(f) charging means provided in the local unit effective to charge each said capacitor to an intermediate voltage value only when the respective load is in open-circuit condition following the respective capacitor being discharged to said low voltage value by said second drive voltage and while no drive voltage is applied to the respective capacitor from the drive voltage means; and (g) detection means provided in the intelligent unit which are operable to detect the condition of each said capacitor at a time in a selected said respective assigned time slot when the respective capacitor will be at said intermediate voltage value if the respective load is in open-circuit condition and hence to detect whether or not the respective load is in open-circuit condition.

2. A system as claimed in claim 1, in which said charging means includes a respective zener diode connected between each capacitor and the respective load to limit the respective capacitor to said high voltage value when charged by the first drive voltage, a source of said intermediate voltage, and a respective resistor connected between the source of said intermediate voltage and each load such that, following the respective capacitor being discharged to said low voltage value by said second drive voltage and while no drive voltage is applied to the respective capacitor from the drive voltage means, if the respective load is in normal condition a low current from said respective resistor flows through the respective load and the capacitor remains at said low voltage value whereas if the respective load is in open-circuit condition the low current from said respective resistor which flows in the forward direction through the respective zener diode charges the respective capacitor to said intermediate voltage value.

3. A system as claimed in claim 1, in which the second drive voltage is applied to ensure that a said capacitor is at said low voltage value at the end of said respective assigned time slot in the frame period preceding that containing said selected time slot, and in which the detection means are operated at the beginning of said selected time slot to detect whether or not the respective load is in open-circuit condition.

4. A system as claimed in claim 1, also comprising:
(h) individual power switch protection means connected to each power switch and to the respective capacitor, the individual protection means being non-conductive when the respective load is in normal condition and becoming conductive when the respective power switch is on with the respective load in short-circuit condition, such that when the individual protection means is conductive the respective capacitor discharges to said low voltage value via the individual protection means and the respective power switch turns off;
and in which the detection means are also operable to detect the condition of each capacitor at a time in a selected said respective assigned time slot when the respective capacitor will be at said low voltage value only if the respective load is in a short-circuit condition and hence to detect whether or not the respective load is in short circuit condition.

5. A system as claimed in claim 4, in which each power switch protection means comprises a semiconductor switch thermally connected to the respective power switch such that the semiconductor switch becomes conductive above a predetermined temperature responsive to heat generated in the respective power switch.

6. A system as claimed in claim 5, in which the semiconductor switch is a thyristor.

7. A system as claimed in claim 4, in which each protection means is connected such that the respective capacitor discharges via that protection means and via the respective load.

8. A system as claimed in claim 1, in which in a first segment of said selected time slot the second drive voltage is applied for a period sufficient to discharge the respective capacitor to said low voltage value, then in a second segment of said selected time slot no drive voltage is applied to the respective capacitor from the drive voltage means for a period sufficient for the respective capacitor to reach said intermediate voltage value, then in a third segment of said selected time slot the first or second drive voltage is applied for a period sufficient respectively to charge or discharge the respective capacitor to said high or low voltage value.

9. A system as claimed in claim 8, also comprising:
(h) individual power switch protection means connected to each power switch and to the respective capacitor, the individual protection means being non-conductive when the respective load is in normal condition and becoming conductive when the respective power switch is on with the respective load in short-circuit condition, such that when the individual protection means is conductive the respective capacitor discharges to said low voltage value via the individual protection means and the respective power switch turns off;
and in which the detection means are also operable to detect the condition of each capacitor at a time in said selected time slot when the respective capacitor will be at said low voltage value only if the respective load is in a short-circuit condition and hence to detect whether or not the respective load is in short-circuit condition.

10. A system as claimed in claim 9, in which the power switch protection means comprises a semiconductor switch thermally connected to the respective power switch such that the semiconductor switch becomes conductive above a predetermined temperature responsive to heat generated in the respective power switch.

11. A system as claimed in claim 10, in which the semiconductor switch is a thyristor.

12. A system as claimed in claim 9, in which each protection means is connected such that the respective capacitor discharges via that protection means and via the respective load.

13. A system as claimed in claim 1, in which the detection means are operable to detect whether or not each load is in open-circuit condition in respective selected frame periods at intervals of a respective selected plurality of frame periods.

14. A system as claimed in claim 4, in which the detection means are operable to detect whether or not each load is in short-circuit condition in respective selected frame periods at intervals of a respective selected plurality of frame periods.

15. A system as claimed in claim 9, in which the detection means are operable to detect whether or not each load is in short-circuit condition in respective selected frame periods at intervals of a respective selected plurality of frame periods.

16. A system as claimed in claim 9, in which the detection means are operable to detect whether or not each load is in open-circuit condition in respective selected frame periods at intervals of a respective selected first plurality of frame periods and to detect whether or not the respective load is in short-circuit condition in respective selected other frame periods at intervals of a respective selected second plurality of frame periods.

17. A method of testing each said load in a system as claimed in claim 1, in which said drive voltage means are operated under control of test equipment connected to the intelligent unit, in which each said selected time slot is selected and said detection means are operated under control of said test equipment, and in which the test equipment registers whether or not the respective load is in open-circuit condition.

18. A method of testing each said load in a system as claimed in claim 4, in which said drive voltage means are operated under control of test equipment connected to the intelligent unit, in which each said selected time slot is selected and said detection means are operated under control of said test equipment, and in which the test equipment registers whether or not the respective load is in open-circuit condition and whether or not the respective load is in short-circuit condition.

19. A method of testing each said load in a system as claimed in claim 9, in which said drive voltage means are operated under control of test equipment connected to the intelligent unit, in which each said selected time slot is selected and said detection means are operated under control of said test equipment, and in which the test equipment registers whether or not the respective load is in open-circuit condition and whether or not the respective load is in short-circuit condition.

20. A local unit for use in a system as claimed in claim 1, said local unit comprising each said power switch, each said capacitor, said means for connecting each said capacitor to the signalling link and said charging means.

21. A local unit for use in a system as claimed in claim 4, said local unit comprising each said power switch, each said capacitor, said means for connecting each said capacitor to the signalling link, said charging means and each said power switch protection means.

22. A local unit for use in a system as claimed in claim 9, said local unit comprising each said power switch, each said capacitor, said means for connecting each said capacitor to the signalling link, said charging means and each said power switch protection means.

23. A method of testing each said load connected to said respective power switch in a local unit as claimed in claim 20 before assembly of the local unit in the system, in which said low current signalling link is provided between the local unit and test equipment, in which said drive voltage means are reproduced in and are operated under control of the test equipment, in which said detection means are reproduced in the test equipment and each said selected time slot is selected and said detection means are operated under control of the test equipment, and in which the test equipment registers whether or not the respective load is in open-circuit condition.

24. A method of testing each said load connected to said power switch in a local unit as claimed in claim 21 before assembly of the local unit in the system, in which said low current signalling link is provided between the local unit and test equipment, in which said drive voltage means are reproduced in and are operated under control of the test equipment, in which said detection means are reproduced in the test equipment and each said selected time slot is selected and said detection means are operated under control of the test equipment, and in which the test equipment registers whether or not the respective load is in open-circuit condition and whether or not the respective load is in short-circuit condition.

25. A method of testing each said load connected to said power switch in a local unit as claimed in claim 22 before assembly of the local unit in the system, in which said low current signalling link is provided between the local unit and test equipment, in which said drive voltage means are reproduced in and are operated under control of the test equipment, in which said detection means are reproduced in the test equipment and each said selected time slot is selected and said detection means are operated under control of the test equipment, and in which the test equipment registers whether or not the respective load is in open-circuit condition and whether or not the respective load is in short-circuit condition.

* * * * *